United States Patent
Kaya

(10) Patent No.: US 7,246,330 B2
(45) Date of Patent: Jul. 17, 2007

(54) APPARATUS AND METHOD FOR DETECTING BODY DIODE CONDUCTION IN A SEMICONDUCTOR DEVICE

(75) Inventor: Cetin Kaya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 337 days.

(21) Appl. No.: 10/962,719

(22) Filed: Oct. 12, 2004

(65) Prior Publication Data

US 2006/0095873 A1    May 4, 2006

(51) Int. Cl.
    G06F 17/50    (2006.01)
    G06F 9/45    (2006.01)
(52) U.S. Cl. .............................. 716/4; 716/6
(58) Field of Classification Search ............ 716/1, 716/2, 4, 6
    See application file for complete search history.

(56) References Cited

U.S. PATENT DOCUMENTS 7,031,175 B2 *   4/2006   Dequina et al. ............ 363/127
2004/0189269 A1 *  9/2004   Lynch ........................ 323/282
2005/0088863 A1 *  4/2005   Pearce ......................... 363/62
2005/0281058 A1 * 12/2005   Batarseh et al. ............. 363/16

* cited by examiner

*Primary Examiner*—Stacy A. Whitmore
*Assistant Examiner*—Magid Y. Dimyan
(74) *Attorney, Agent, or Firm*—Wade J. Brady, III; Frederick J. Telecky, Jr.

(57) ABSTRACT

An apparatus is for detecting body diode conduction in a semiconductor device that includes first regions fixed with a substrate having an upper surface to establish a source, gate and drain with drain-to-source current flow parallel with the surface. The first regions experience body diode conduction in a first inter-region current flow among first involved regions. The apparatus includes: second regions fixed with the substrate and substantially similar in relative size and placement with respect to other second regions as a corresponding first region is in relative size and placement with respect to other first regions. The second regions experience model body diode conduction in a second inter-region current flow among second involved regions. The model body diode conduction occurs generally contemporaneously with the body diode conduction. Selected second regions are coupled with selected first regions to establish a connection locus to permit detecting the model body diode conduction.

2 Claims, 7 Drawing Sheets

US 7,246,330 B2

APPARATUS AND METHOD FOR DETECTING BODY DIODE CONDUCTION IN A SEMICONDUCTOR DEVICE

BACKGROUND OF THE INVENTION

The present invention is directed to semiconductor devices, and especially to laterally diffused metal oxide semiconductor (LDMOS) devices. Metal oxide semiconductor (MOS) devices, including LDMOS devices, experience a phenomenon known as body diode conduction. Body diode conduction is a conduction of current between two regions of the MOS device, usually between a source structure and a drain structure. The effect of body diode conduction is to skew the response of the MOS device to gating signals from voltage response pattern to on-gate and off-gate conditions having a substantially precise relation with the gate signals to a skewed or delayed response pattern. The skewed response pattern when experiencing body diode conduction may have a time-delayed on response to an on-gate signal, may have a delayed off response to an off-gate signal or may exhibit delay in responding both to on-gate and off-gate signals. A contributing factor to such a skewed response pattern is the normal reverse recovery losses associated with many diode structures, including body diode structures interior of an MOS device. Reverse recovery losses result from a reverse recovery transient that depends upon an individual diode structure. Reverse recovery transients are affected by several factors, including by way of example and not by way of limitation, junction temperature of the diode structure, forward current prior to the diode structure being reverse biased, the rate of fall of forward current through the diode structure and the source voltage that is applied to the reverse bias of the diode structure. Because of the various factors affecting reverse recovery of a diode structure, prediction of reverse recovery (e.g., in terms of its duration) is difficult.

Prior art circuits employing MOS devices have been constructed to detect body diode conduction using comparators that detect when drain potential is below source potential. Such an approach works acceptably for detecting body diode conduction in low side circuitry of differential signaling circuits. However, such an approach is of limited utility and may require large area to implement in high side circuitry, such as pulse width modulation control circuits. This is especially so in process technologies that do not use well isolated n-channel FETs (field effect transistors). Shortcomings of using such a comparator-based design are further exacerbated because in such circuits, when the drain of the high side circuitry goes high, voltages in the range of about 30–80 volts can be attained. Such high voltages complicate design of the required comparators.

The present invention senses various parameters regarding current, including the magnitude and duration of the current, occasioned by the presence of body diode conduction rather than depending upon the $V_{ds}$ (drain-to-source voltage) of an MOS device.

There is a need for an apparatus and method for detecting body diode conduction in an MOS (metal oxide semiconductor) device without significantly contributing to the area required for implementing the MOS device.

SUMMARY OF THE INVENTION

The present invention provides a structure to allow estimation of body diode current in a MOS device by providing a scaled model device which emulates regions of the MOS device. The model device uses a second p-region in the n-well of the MOS device to form a body diode which emulates the body diode formed with a first p-region of the MOS device in the n-well. The current of the emulation body diode is extracted by a pull-up of a collector region in the second p-region where the collector region corresponds to the source region of the MOS device.

The insulated gate of the MOS device is over the first p-region between the source region and the n-well, and the insulated gate of the model device is over the second p-region between the collector region and the n-well. The insulated gate of the model device is connected to the source region of the MOS device, the first p-region of the MOS device, and the second p-region of the model device.

An estimate of the body diode current is used to adjust timing of switching of the MOS device.

DETAILED DESCRIPTION OF THE PREFERRED EMBODIMENT

Figure 1:
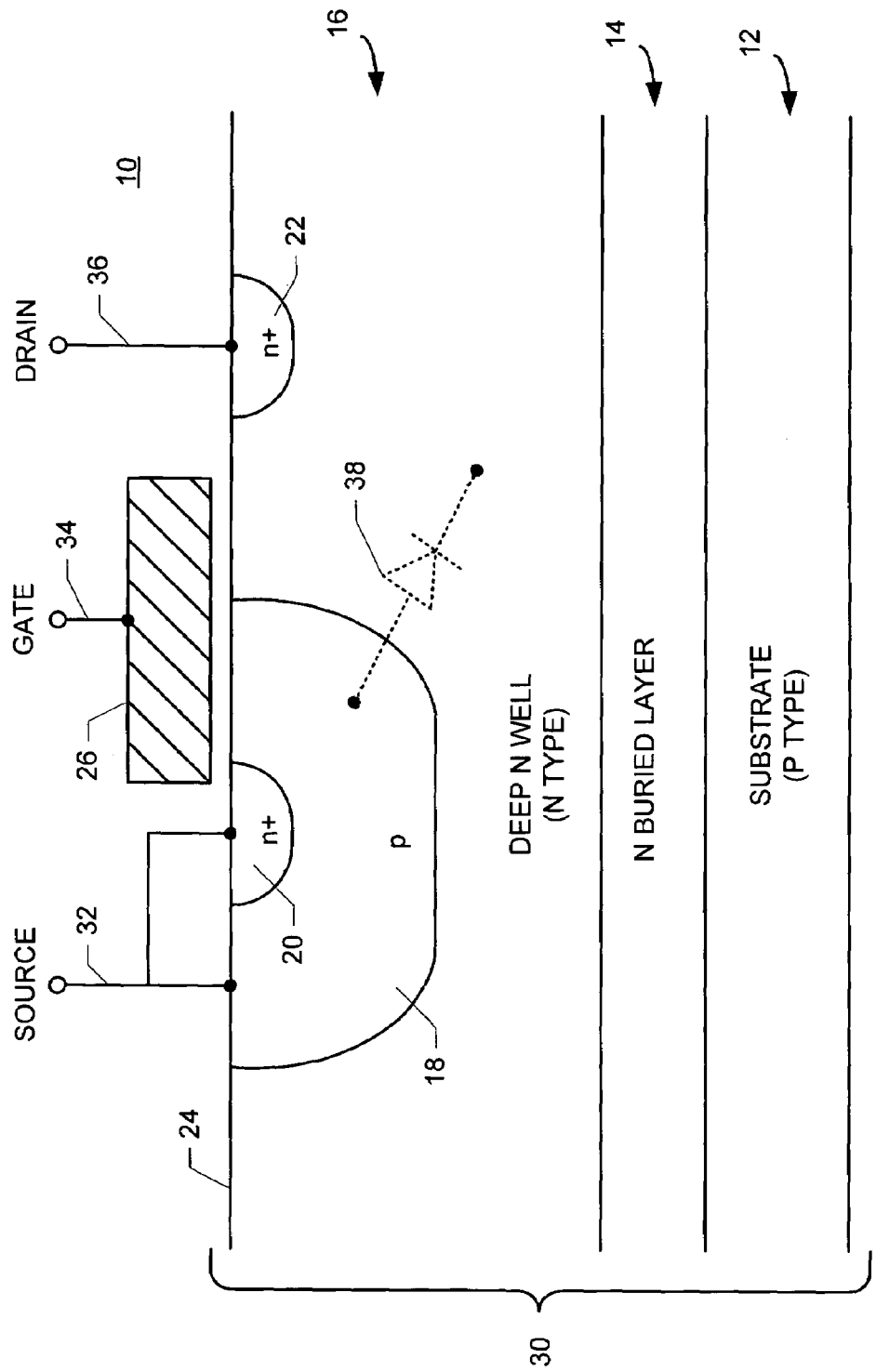
FIG. 1 is a schematic diagram illustrating a laterally diffused metal oxide semiconductor (LDMOS) device configured according to the prior art.

FIG. 1 is a schematic diagram illustrating a laterally diffused metal oxide semiconductor (LDMOS) device configured according to the prior art. In FIG. 1, a laterally diffused metal oxide semiconductor (LDMOS) device 10 includes a laminate structure 30. Laminate structure 30 includes a substrate 12 composed of p-type material upon which is arrayed an n buried layer 14. A deep n-well 14 composed of n-type material is arrayed upon n buried layer 14. A region 18 of p-type material is situated in deep n-well 16, and a region 20 of n-type material is substantially wholly enclosed within region 18. A region 22 of n-type material is situated in deep n-well 16 displaced from region 18. Regions 18, 20, 22 are each independently electrically accessible from above an upper surface 24 of laminate structure 30. A gate structure 26 is situated above upper surface 24 in a position spanning portions of regions 18, 20 and a portion of deep n-well 16.

A source lead 32 is coupled with regions 18, 20. A gate lead 34 is coupled with gate structure 26. A drain lead 36 is coupled with region 22. A diode structure is inherently established between region 18 and deep n-well 16, indicated by a virtual body diode 38 in dotted line format. In operation, LDMOS device 10 establishes drain-to-source current flow from region 22 to regions 18, 20 generally parallel with upper surface 24. Once body diode 38 has been forward biased (i.e., biased forward from region 18 to deep n-well 16), reverse recovery transients associated with body diode 38 may affect a change in drain-to-source current when LDMOS device 10 is turned off by appropriate lowering of gate voltage applied to gate lead 34.

Figure 2:
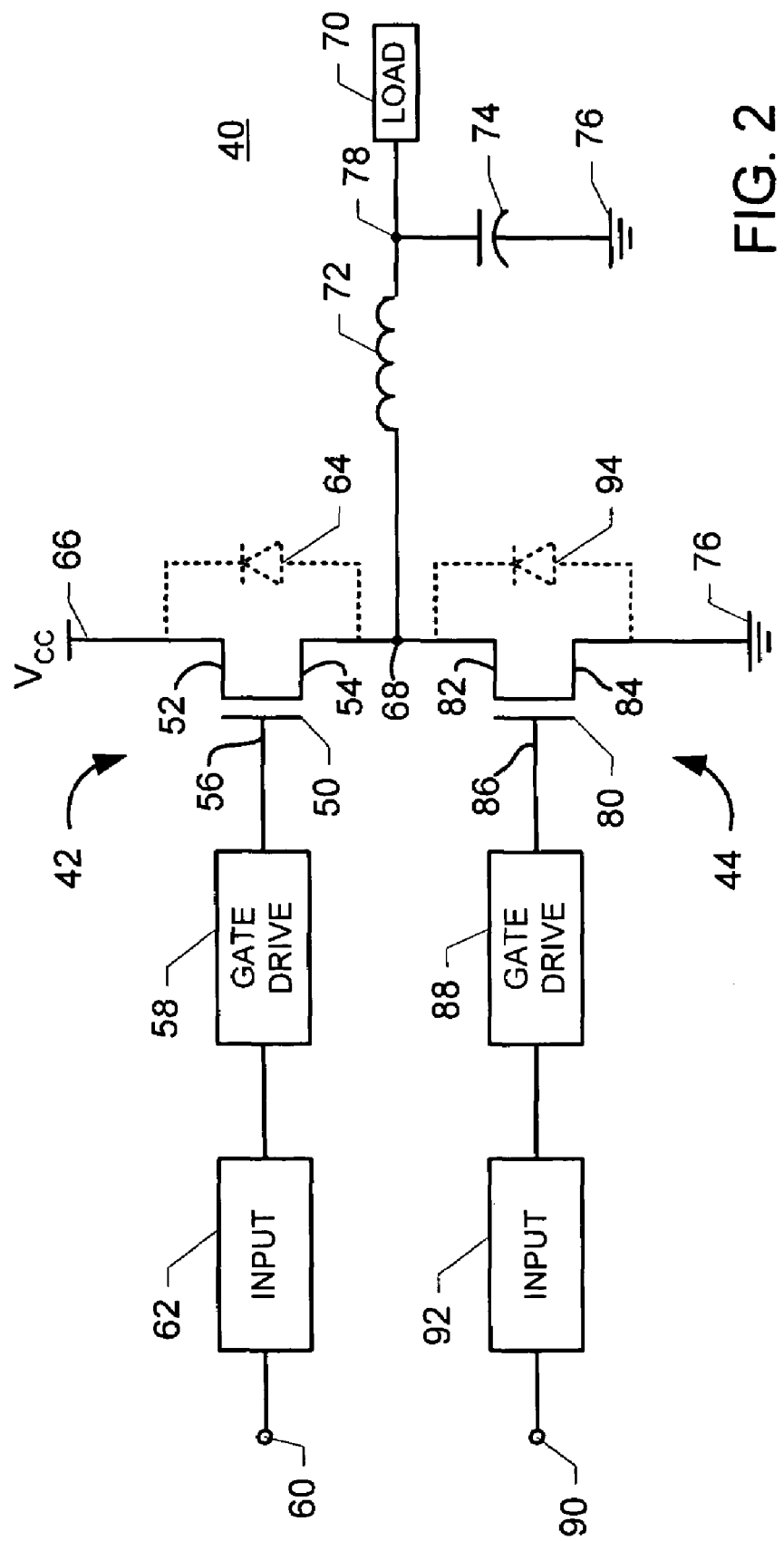
FIG. 2 is an electrical schematic diagram of a circuit using MOS devices having body diode conduction.

FIG. 2 is an electrical schematic diagram of a circuit using MOS devices having body diode conduction. In FIG. 2, a control circuit 40 is configured using a half H-bridge that includes a high side 42 and a low side 44. High side 42 includes a high side MOS transistor 50 having a drain 52, a source 54 and a gate 56. Gate 56 is driven by a gate drive circuit 58 in response to an input signal received from an input locus 60 via an input circuit 62. Transistor 50 has an internal body diode 64 (substantially as described earlier herein in connection with FIG. 1) effectively coupling source 54 with drain 52. Transistor 50 is coupled between a supply voltage locus 66 receiving a supply voltage $V_{CC}$ and an output locus 68.

A load 70 is coupled with output locus 68 via an inductor 72. A capacitor 74 coupled between ground 76 and a connection locus 78 between load 70 and inductor 72 provides filtering.

Low side 44 includes a low side MOS transistor 80 having a drain 82, a source 84 and a gate 86. Gate 86 is driven by a gate drive circuit 88 in response to an input signal received from an input locus 90 via an input circuit 92. Transistor 80 has an internal body diode 94 (substantially as described earlier herein in connection with FIG. 1) effectively coupling source 84 with drain 82. Transistor 80 is coupled between output locus 68 and ground 76.

Figure 3:
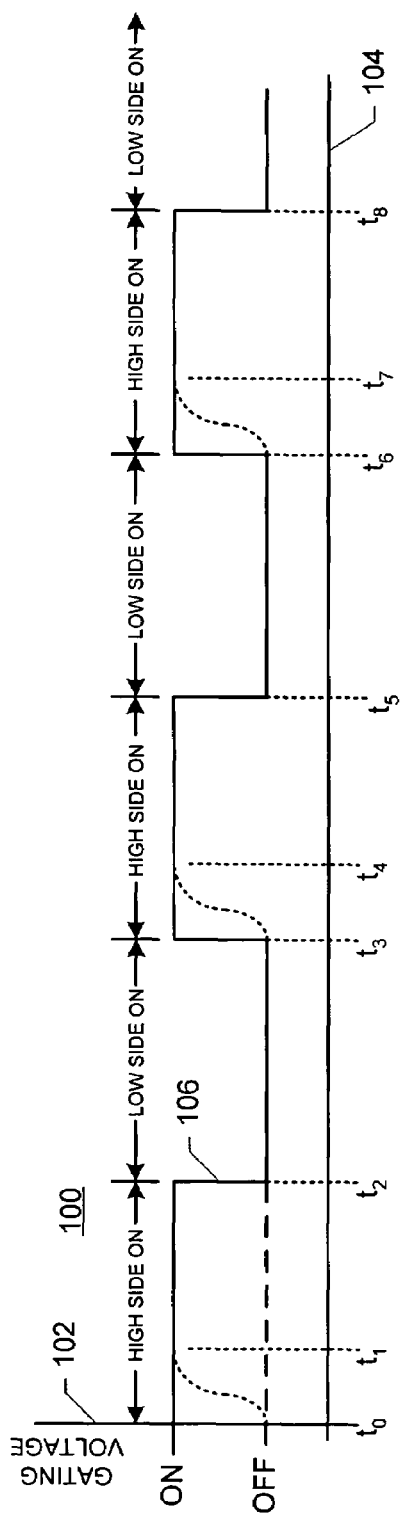
FIG. 3 is a graphical representation of representative output signals in response to pulse width modulation gating signals that may be used to control the MOS devices when current is flowing out of the circuit illustrated in FIG. 2.
Figure 4:
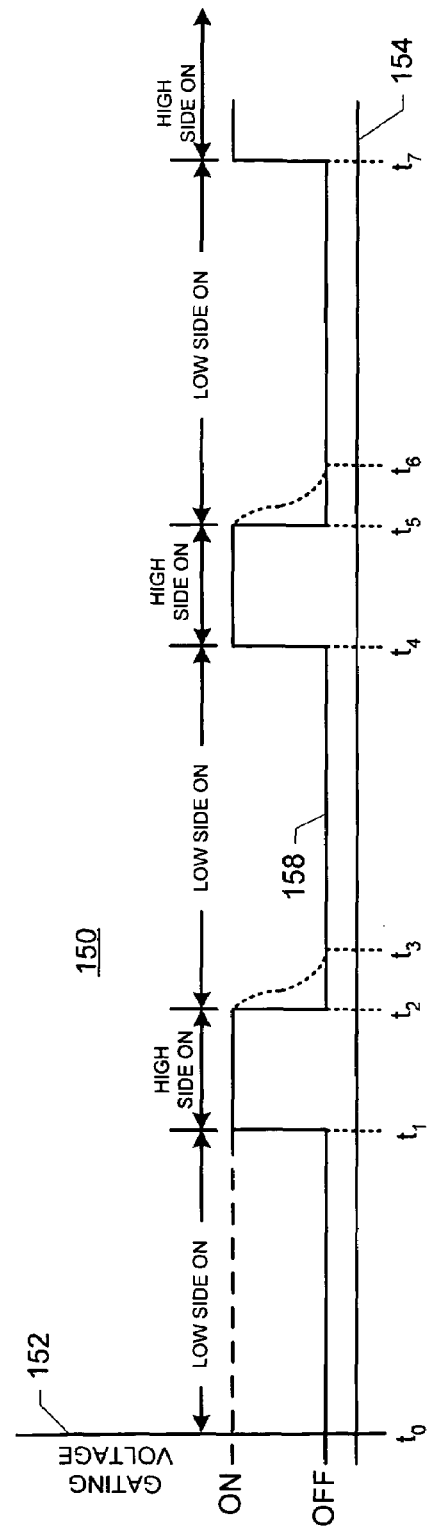
FIG. 4 is a graphical representation of representative output signals in response to pulse width modulation gating signals that may be used to control the MOS devices when current is flowing into the circuit illustrated in FIG. 2.

Operation of control circuit 40 is better understood when considered in connection with FIGS. 3 and 4.

FIG. 3 is a graphical representation of representative output signals in response to pulse width modulation gating signals that may be used to control the MOS devices when current is flowing out of the circuit illustrated in FIG. 2. In FIG. 3, a graphical representation 100 indicates output signals on an axis 102 and indicates time on an axis 104. Response curve 106 indicates voltage levels at output locus 68 when current is flowing out of circuit 40 into load 70. Superimposed on response curve 106 is an indication of whether a HIGH SIDE gating signal is in a state for gating MOS 50 on or off. The HIGH SIDE gating signal is at a level sufficient to gate high side MOS transistor 50 on during time intervals $t_0$–$t_2$, $t_3$–$t_5$, $t_6$–$t_8$.

For purposes of this simplified explanation a LOW SIDE gating signal for gating low MOS 80 on or off is 180 degrees out of phase with respect to the HIGH SIDE gating signal. That is, the LOW SIDE gating signal is at a level sufficient to gate low side MOS transistor 80 on during time intervals $t_2$–$t_3$, $t_5$–$t_6$, and after time $t_8$.

Prior to time $t_0$ the LOW SIDE gating signal has been high so that low MOS 80 has been on. When MOS 80 is turned on and current is flowing out of circuit 40, body diode 94 (FIG. 2) is forward biased (assuming that a requisite voltage drop occurs across MOS 80, e.g., 0.7 volts) and some current flow has occurred through body diode 94. Body diode 64 is reverse biased, so no current flow occurs through body diode 64. At time $t_0$, the HIGH SIDE gating signal goes high and gates MOS 50 on so that current begins to flow through MOS 50, and the LOW SIDE gating signal goes low so that low MOS 80 is turned off. Response curve 106 (voltage at output locus 68 when current is flowing out of circuit 40) moves toward an ON signal level. However, because body diode 94 was forward biased just prior to time $t_0$, the phenomenon of reverse recovery common in diode structures occurs.

Current does not reverse instantaneously in a diode. Reverse biasing a diode causes current through the diode to fall rapidly and then reverse itself before it becomes zero. This transient characteristic of a diode is often expressed in terms of time, as in reverse recovery time. The reverse-recovery transient process depends on the diode itself and also depends on the junction temperature of the diode, the forward current prior to being reverse biased, the rate of fall of the forward current and the source voltage that applies the reverse bias to the diode. As the value of any one of these parameters rises with the other parameters remaining unchanged, the reverse recovery transient process becomes worse, reflected by an increase in the peak reverse current. The reverse recovery turn-off period starts once the diode current becomes negative and lasts until the reverse diode current increases in amplitude first and then decays to about 10% of its reverse peak current. The reverse recovery turn-off period represent is the time that must elapse before the diode recovers its ability to block reverse voltage.

It because of such a reverse recovery transient condition that response curve 106 is delayed in reaching its ON level, as indicated by the dotted line response section during time interval $t_0$–$t_1$. At time $t_2$ the HIGH SIDE gating signal goes low, turning off MOS 50 and LOW SIDE gating signal goes high, turning on MOS 80. Current through MOS 50 goes low at time $t_2$ and response curve 106 goes to an OFF or low level at time $t_2$ without significant delay because body diode 64 was never forward biased so no reverse recovery transient condition occurs.

At time $t_3$ LOW SIDE gating signal goes low turning off MOS 80 and HIGH SIDE gating signal goes high turning on MOS 50. Because body diode 94 was forward biased when MOS 80 was on during the interval $t_2$–$t_3$, current at locus 68 experiences a reverse recovery transient condition and is delayed in reaching its maximum ON level, as indicated by the dotted line response section during time interval $t_3$–$t_4$. Another reverse recovery transient condition is experienced by circuit 40 when the HIGH SIDE gating signal turns on MOS 50 after MOS 80 has been on for a time, as indicated by the dotted line response section during time interval $t_6$–$t_7$.

FIG. 4 is a graphical representation of representative output signals in response to pulse width modulation gating signals that may be used to control the MOS devices when current is flowing into the circuit illustrated in FIG. 2. In FIG. 4, a graphical representation 150 indicates output signals on an axis 152 and indicates time on an axis 154. A response curve 158 indicates voltage levels at output locus 68 when current is flowing into circuit 40 from load 70. An example of a situation in which circuit 40 may experience current flowing out of locus 68 at some times and into locus 68 at other times is when circuit 40 is employed in controlling driving of an audio amplifier. Superimposed on response curve 158 is an indication of whether a LOW SIDE gating signal is in a state for gating MOS 80 on or off. The LOW SIDE gating signal is at a level sufficient to gate low side MOS transistor 80 on during time intervals $t_0$–$t_1$, $t_2$–$t_4$, $t_5$–$t_7$.

For purposes of this simplified explanation a HIGH SIDE gating signal for gating MOS 50 on or off is 180 degrees out of phase with respect to the LOW SIDE gating signal. That is, the HIGH SIDE gating signal is at a level sufficient to gate high side MOS transistor 50 on during time intervals $t_1$–$t_2$, $t_4$–$t_5$, and after time $t_7$.

From time $t_0$ to time $t_1$ the LOW SIDE gating signal is high so that MOS 80 is on. When MOS 80 is turned on and current is flowing into circuit 40, body diode 94 (FIG. 2) is reverse biased, so no current flow occurs through body diode 94. MOS 50 is turned off during the interval $t_0$–$t_1$ because the HIGH SIDE gating signal is low. At time $t_1$, the HIGH SIDE gating signal gates MOS 50 on so that current begins to flow through MOS 50 and the LOW SIDE gating signal goes low so that MOS 80 is turned off. Body diode 64 is forward biased (assuming that a requisite voltage drop occurs across MOS 50, e.g., 0.7 volts) and some current flow has occurred through body diode 64. Response curve 158 (voltage at output locus 68 when current is flowing into circuit 40) moves toward an ON level substantially without delay because body diode 64 was not reverse biased so no reverse recovery transient condition occurs.

At time $t_2$ the LOW SIDE gating signal goes high, turning on MOS 80 and the HIGH SIDE gating signal goes low, turning off MOS 50. Body diode 94 is reverse biased, so no current flows through body diode 94. Current through MOS 50 goes low at time $t_2$. Because body diode 64 is forward biased during time interval $t_1$–$t_2$ the phenomenon of reverse recovery common in diode structures occurs when MOS 50 is turned off and MOS 80 is turned on at time $t_2$. It is because of such a reverse recovery transient condition that response curve 158 is delayed in reaching its OFF level, as indicated by the dotted line response section during time interval $t_2$–$t_3$.

At time $t_4$ the HIGH SIDE gating signal goes high turning on MOS 50 and the LOW SIDE gating signal goes low turning off MOS 80. Response curve 158 (voltage at output locus 68 when current is flowing into circuit 40) moves toward an ON level substantially without delay without delay because body diode 64 was not reverse biased so no reverse recovery transient condition occurs. Another reverse recovery transient condition is experienced by circuit 40 when the HIGH SIDE gating signal turns off MOS 50 after MOS 50 has been on for a time, as indicated by the dotted line response section during time interval $t_5$–$t_6$.

Figure 5:
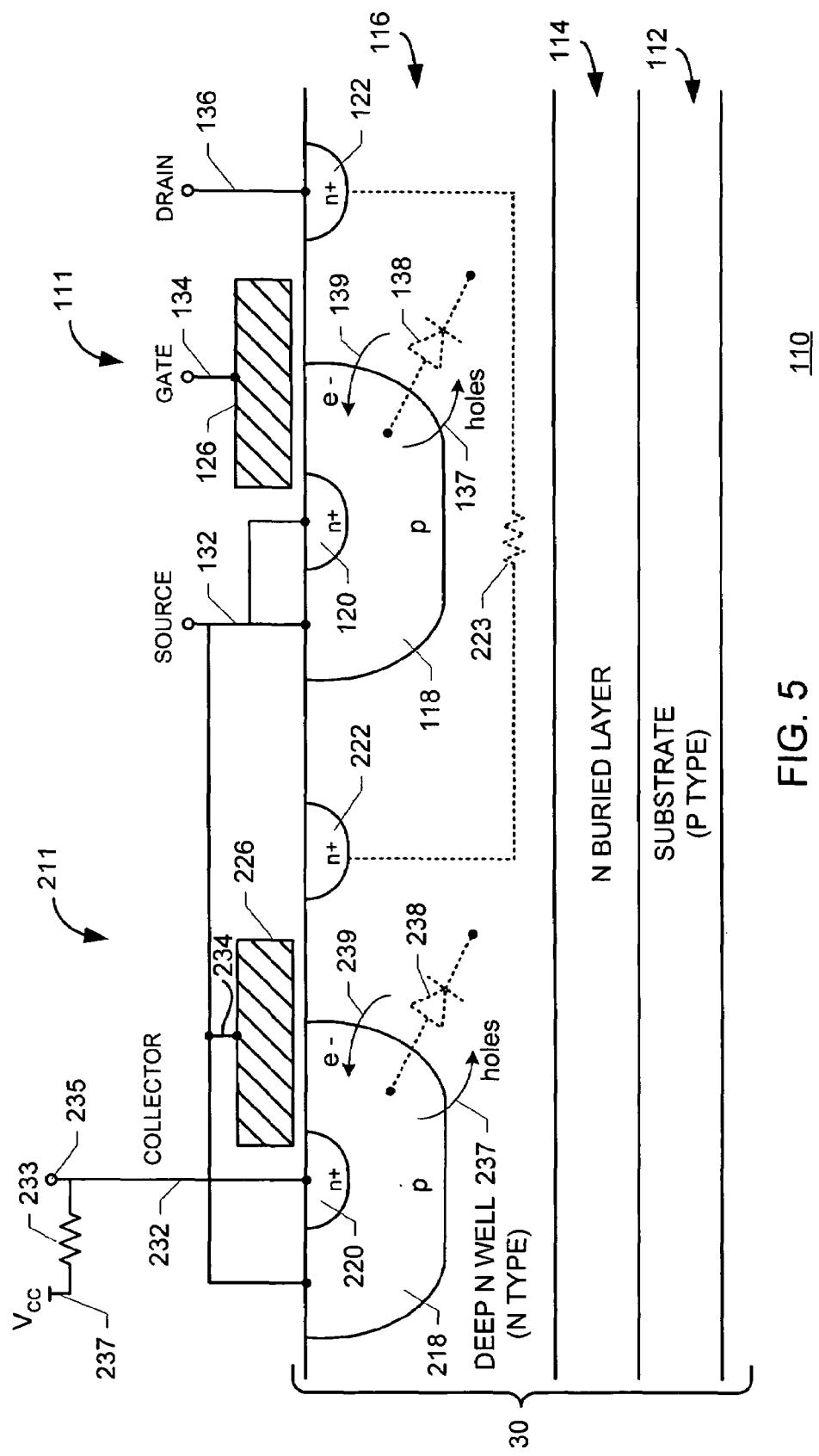
FIG. 5 is a schematic diagram illustrating a laterally diffused metal oxide semiconductor (LDMOS) device configured according to the present invention.

FIG. 5 is a schematic diagram illustrating a laterally diffused metal oxide semiconductor (LDMOS) device configured according to the present invention. In FIG. 5, a laterally diffused metal oxide semiconductor (LDMOS) device 110 includes a parent LDMOS device 111 and a model LDMOS device 211. LDMOS device 110 includes a laminate structure 130. Laminate structure 130 includes a substrate 112 composed of p-type material upon which is arrayed an n buried layer 114. A deep n-well 116 composed of n-type material is arrayed upon n buried layer 114. Parent LDMOS device 111 includes a region 118 of p-type material situated in deep n-well 116, and a region 120 of n-type material substantially wholly enclosed within region 118. A region 122 of n-type material is situated in deep n-well 116 displaced from region 118. Regions 118, 120, 122 are each independently electrically accessible from above an upper surface 124 of laminate structure 130. A gate structure 126 is situated above upper surface 124 in a position spanning portions of regions 118, 120 and a portion of deep n-well 116.

A source lead 132 is coupled with regions 118, 120. A gate lead 134 is coupled with gate structure 126. A drain lead 136 is coupled with region 122. A diode structure is inherently established between region 118 and deep n-well 116, indicated by a virtual body diode 138 in dotted line format.

Model LDMOS device 211 includes a region 218 of p-type material situated in deep n-well 216, and a region 220 of n-type material substantially wholly enclosed within region 218. A region 222 of n-type material is situated in deep n-well 116 displaced from region 218. Regions 218, 220, 222 are each independently electrically accessible from above an upper surface 124 of laminate structure 130. A gate structure 226 is situated above upper surface 124 in a position spanning portions of regions 218, 220 and a portion of deep n-well 116.

Source lead 132 of parent LDMOS device 111 is coupled with a gate lead 234 and with region 218 of model LDMOS device 211. Region 222 of model LDMOS device 211 is not provided with a lead and is coupled with region 122 of parent LDMOS device 111 only via deep n-well 116, as indicated by a resistor 223 indicated in phantom. This construction and interconnection of leads and regions between parent LDMOS device 111 and model LDMOS device 211 establishes a lead coupled with region 220 as a collector lead 232.

When parent LDMOS device 111 is properly biased for operation, a forward bias is established across body diode 138 so that body diode conduction is established by electrons e− moving from deep n-well 116 to region 118, as indicated by an arrow 139, and holes moving from region 118 to deep n-well 116, as indicated by an arrow 137. As suggested by its descriptive term, model LDMOS device 211 is configured as a model of parent LDMOS device 111. Various regions and components 218, 220, 222, 226 of model LDMOS device 211 are arranged with respect to each other in terms of relative size and placement as the various regions and components 218, 220, 222, 226 of parent LDMOS device are arranged with respect to each other in terms of relative size and placement.

The connection between regions 122, 222 via deep n-well 116 establishes those regions at substantially similar potential and source lead 132 is coupled with region 220 so that when parent LDMOS device is biased appropriately to establish body diode conduction through body diode 138, model LDMOS device 211 is also biased to establish body diode conduction through body diode 238. That is, a forward bias is established across body diode 238 so that body diode conduction is established by electrons e− moving from deep n-well 116 to region 218, as indicated by an arrow 239, and holes moving from region 218 to deep n-well 116, as indicated by an arrow 237. Because model LDMOS device 211 is scaled to model parent LDMOS device 111, body diode conduction through body diode 238 is proportional to body diode conduction 138. The scale relation between model LDMOS device 211 and parent LDMOS device 111 may by any scale, including a 1:1 scale or even providing that model LDMOS device 211 is larger than parent LDMOS device 111. It is preferred that the scale relation between model LDMOS device 211 and parent LDMOS device 111 establish model LDMOS device 211 at about one one-hundredth the size of parent LDMOS device 111.

Collector lead 232 is situated appropriately to sense body diode conduction through body diode 238 as a current. Because model LDMOS device 211 is proportionately modeled upon parent LDMOS device 111, body diode current through body diode 238 will be proportional to body diode current through body diode 138. Coupling collector lead 232 with an output locus 235 and providing a supply voltage $V_{CC}$ in series with a resistor 233 to collector lead 232 presents a voltage at output locus 235 that represents body diode conduction experienced by body diode 238 that may be used for gating control purposes, as described in connection with FIG. 6.

Figure 6:
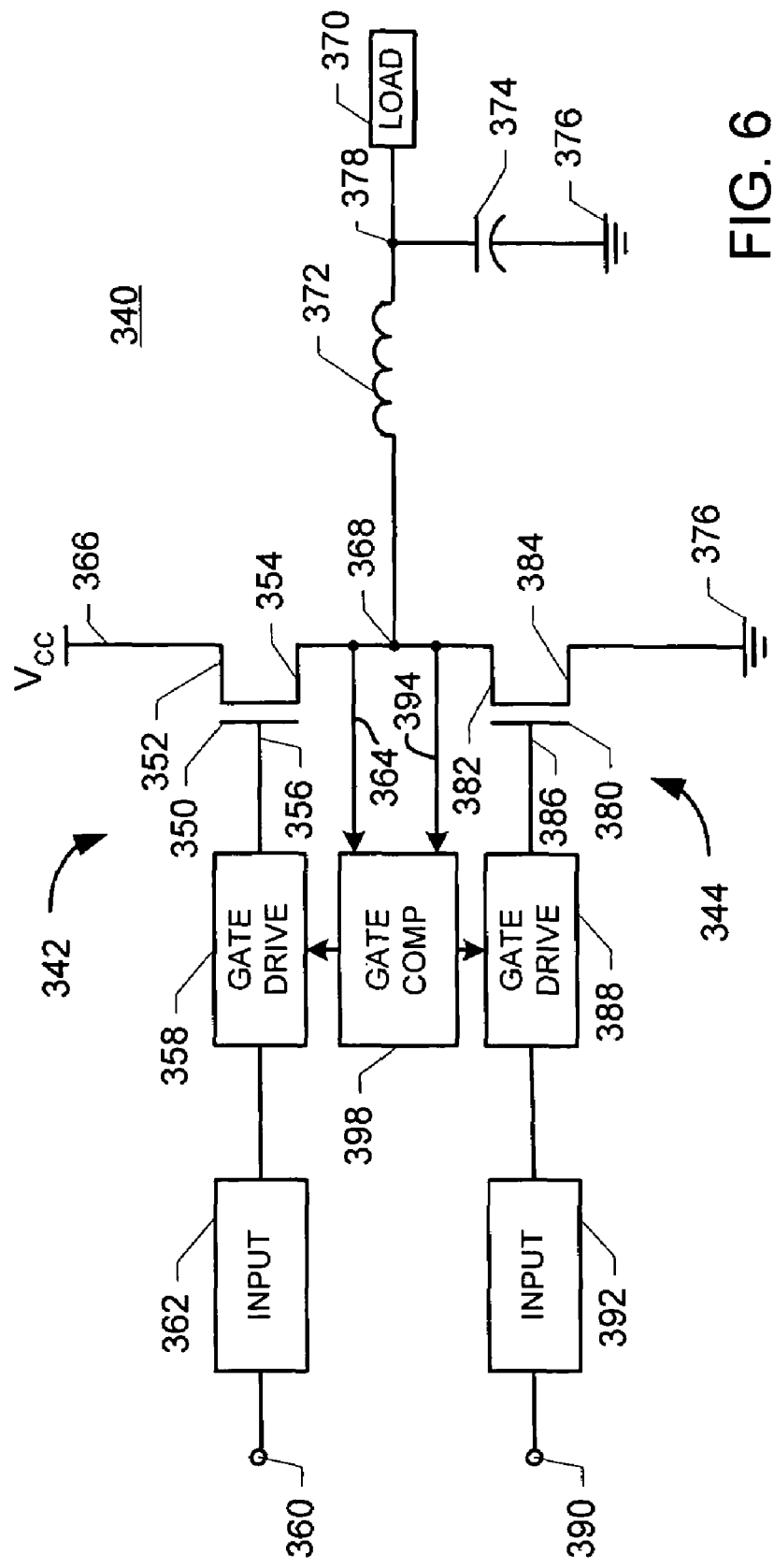
FIG. 6 is an electrical schematic diagram of a circuit using MOS devices employing the apparatus of the present invention.

FIG. 6 is an electrical schematic diagram of a circuit using MOS devices employing the apparatus of the present invention. In FIG. 6, a control circuit 340 is configured as a half H-bridge that includes a high side 342 and a low side 344. High side 342 includes a high side MOS transistor 350 having a drain 352, a source 354 and a gate 356. Gate 356 is driven by a gate drive circuit 358 in response to an input signal received from an input locus 360 via an input circuit 362. Transistor 350 is configured according to the present invention as described in connection with FIG. 5 so that a collector lead 364 is provided. Collector lead 364 provides a voltage output signal indicating body diode conduction in transistor 350. Transistor 350 is coupled between a supply voltage locus 366 receiving a supply voltage $V_{CC}$ and an output locus 368.

A load 370 is coupled with output locus 368 via an inductor 372. A capacitor 374 coupled between ground 376 and a connection locus 378 between load 370 and inductor 372 provides filtering.

Low side 344 includes a low side MOS transistor 380 having a drain 382, a source 384 and a gate 386. Gate 386 is driven by a gate drive circuit 388 in response to an input signal received from an input locus 390 via an input circuit 392. Transistor 380 is configured according to the present invention as described in connection with FIG. 5 so that a collector lead 394 is provided. Collector lead 394 provides a voltage output signal indicating body diode conduction in transistor 380. Transistor 380 is coupled between output locus 368 and ground 376.

A gate compensating unit 398 is connected with gate drive circuits 358, 388 and is also coupled with collector leads 364, 394. Signals from collector leads 364, 394 indicate aspects of body diode conduction in MOS transistors 350, 380 such as presence of body diode conduction, the forward current prior to being reverse biased, the rate of fall of the forward current, the source voltage that applies the reverse bias to the diode, duration of conduction and other aspects. Gate compensating unit 398 employs signals from collector leads 364, 394 to adjust gating of MOS transistors 350, 380 to compensate for the effects of reverse recovery transients in MOS transistors 350, 380.

Figure 7:
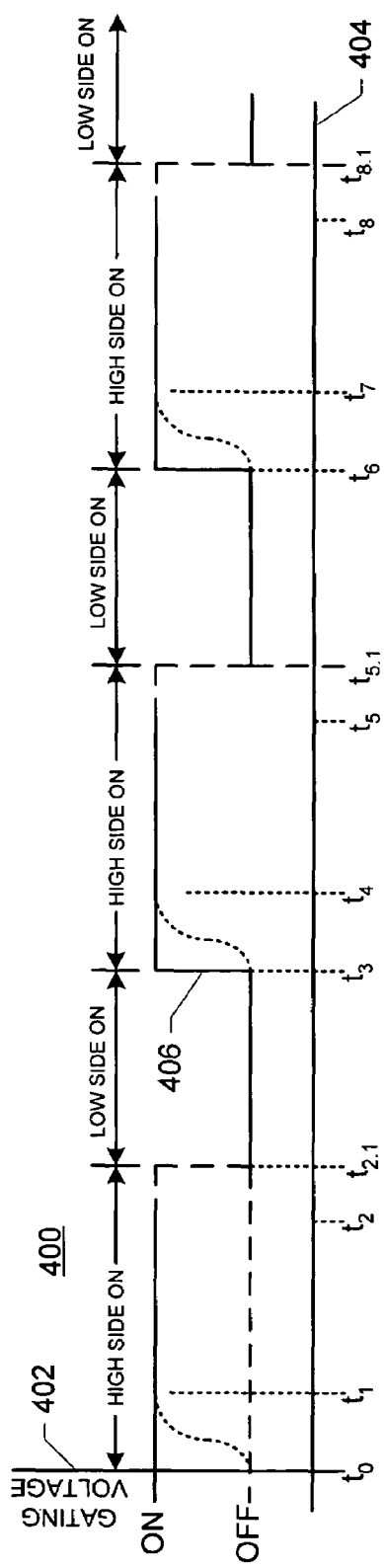
FIG. 7 is a graphical representation of representative voltages present in the circuit illustrated in FIG. 6 as the MOS devices are operated with current flowing out of the circuit.
Figure 8:
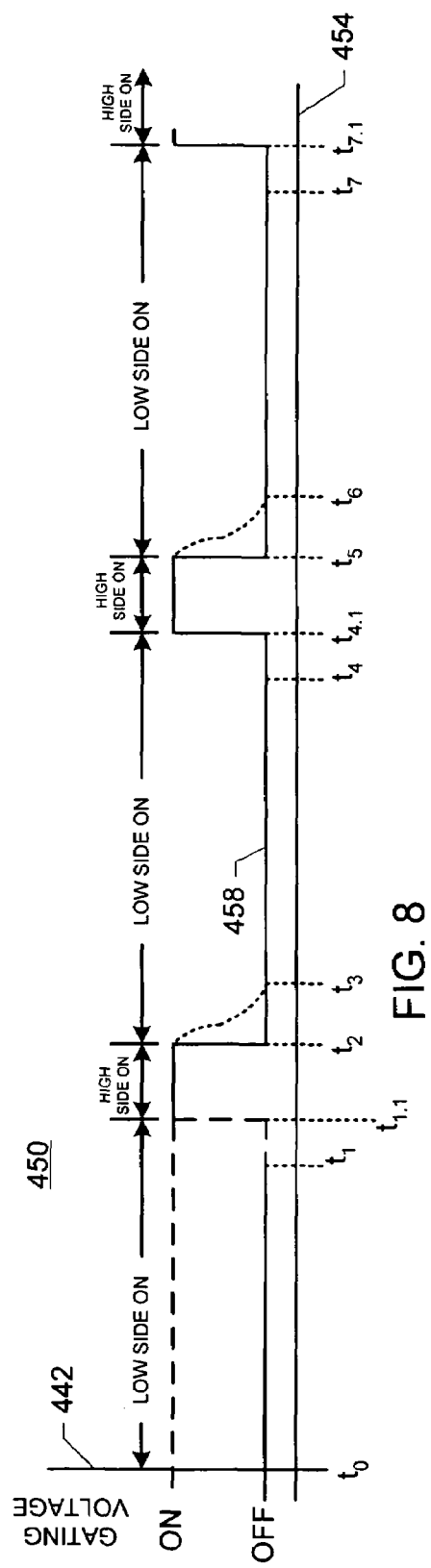
FIG. 8 is a graphical representation of representative voltages present in the circuit illustrated in FIG. 6 as the MOS devices are operated with current flowing into the circuit.

Operation of control circuit 340 is better understood when considered in connection with FIGS. 7 and 8.

FIG. 7 is a graphical representation of representative voltages present in the circuit illustrated in FIG. 6 as the MOS devices are operated with current flowing out of the circuit. In FIG. 7, a graphical representation 400 indicates output signals on an axis 402 and indicates time on an axis 404. Response curve 406 indicates current levels at output locus 368 when current is flowing out of circuit 340 into load 370. Superimposed on response curve 406 is an indication of whether a HIGH SIDE gating signal from gate drive circuit 358 is in a state for gating MOS 350 on or off. Absent input to gate drive circuit 358 from collector leads 364, 394 via gate compensating unit 398, the HIGH SIDE gating signal would have been set at a level sufficient to gate high side MOS transistor 350 on during time interval $t_0$–$t_2$. However, because of the effects of reverse recovery transients (described in connection with FIGS. 2–4), the HIGH SIDE gating signal is delayed for a time interval $t_0$–$t_1$ before reaching its ON level. Gate compensating unit 398 employs signals from collector leads 364, 394 to adjust the HIGH SIDE gating signal to stay at its ON level for a period after time $t_2$ until time $t_{2.1}$. The duration of time interval $t_2$–$t_{2.1}$ is calculated to compensate for the delay experienced by the HIGH SIDE gating signal in achieving its ON signal level following time $t_0$. Gate compensating unit 398 also employs signals from collector leads 364, 394 to adjust the HIGH SIDE gating signal to stay at its ON level for a period after time $t_5$ until time $t_{5.1}$. The duration of time interval $t_5$–$t_{5.1}$ is calculated to compensate for the delay experienced by the HIGH SIDE gating signal in achieving its ON signal level following time $t_3$. Gate compensating unit 398 further employs signals from collector leads 364, 394 to adjust the HIGH SIDE gating signal to stay at its ON level for a period after time $t_8$ until time $t_{8.1}$. The duration of time interval $t_8$–$t_{8.1}$ is calculated to compensate for the delay experienced by the HIGH SIDE gating signal in achieving its ON signal level following time $t_6$.

For purposes of this simplified explanation a LOW SIDE gating signal for gating MOS 380 on or off is 180 degrees out of phase with respect to the HIGH SIDE gating signal. That is, the LOW SIDE gating signal is at a level sufficient to gate low side MOS transistor 380 during time intervals $t_{2.1}$–$t_3$, $t_{5.1}$–$t_6$, and after time $t_{8.1}$.

FIG. 8 is a graphical representation of representative voltages present in the circuit illustrated in FIG. 6 as the MOS devices are operated with current flowing into the circuit. In FIG. 8, a graphical representation 450 indicates output signals on an axis 452 and indicates time on an axis 454. Response curve 458 indicates voltage levels at output locus 368 when current is flowing into circuit 340 from load 370. Superimposed on response curve 458 is an indication of whether a LOW SIDE gating signal from gate drive circuit 388 is in a state for gating MOS 380 on or off. Absent input to gate drive circuit 388 from collector leads 364, 394 via gate compensating unit 398, the LOW SIDE gating signal would have been set at a level sufficient to gate low side MOS transistor 380 off during time interval $t_1$–$t_2$. However, because of the effects of reverse recovery transients (described in connection with FIGS. 2–4), the current into circuit 340 is delayed reaching its ON signal level for a time interval $t_2$–$t_3$. Gate compensating unit 398 employs signals from collector leads 364, 394 to adjust the LOW SIDE gating signal to stay at its ON level for a period after time $t_1$ until time $t_{1.1}$. The duration of time interval $t_1$–$t_{1.1}$ is calculated to compensate for the delay expected to be experienced by the LOW SIDE gating signal in achieving its ON signal level following time $t_2$. Gate compensating unit 398 also employs signals from collector leads 364, 394 to adjust the LOW SIDE gating signal to stay at its ON level for a period after time $t_4$ until time $t_{4.1}$. The duration of time interval $t_4$–$t_{4.1}$ is calculated to compensate for the delay expected to be experienced by the LOW SIDE gating signal in achieving its ON signal level following time $t_5$. Gate compensating unit 398 further employs signals from collector leads 364, 394 to adjust the LOW SIDE gating signal to stay at its ON level for a period after time $t_7$ until time $t_{7.1}$. The duration of time interval $t_7$–$t_{7.1}$ is calculated to compensate for the delay expected to be experienced by the LOW SIDE gating signal in achieving its ON signal level at a time after time $t_{7.1}$ (not shown in FIG. 8).

For purposes of this simplified explanation a HIGH SIDE gating signal for gating MOS 350 on or off is 180 degrees out of phase with respect to the LOW SIDE gating signal. That is, the HIGH SIDE gating signal is at a level sufficient to gate high side MOS transistor 350 during time intervals $t_0$–$t_{1.1}$, $t_2$–$t_{4.1}$, $t_5$–$t_{7.1}$.

Figure 9:
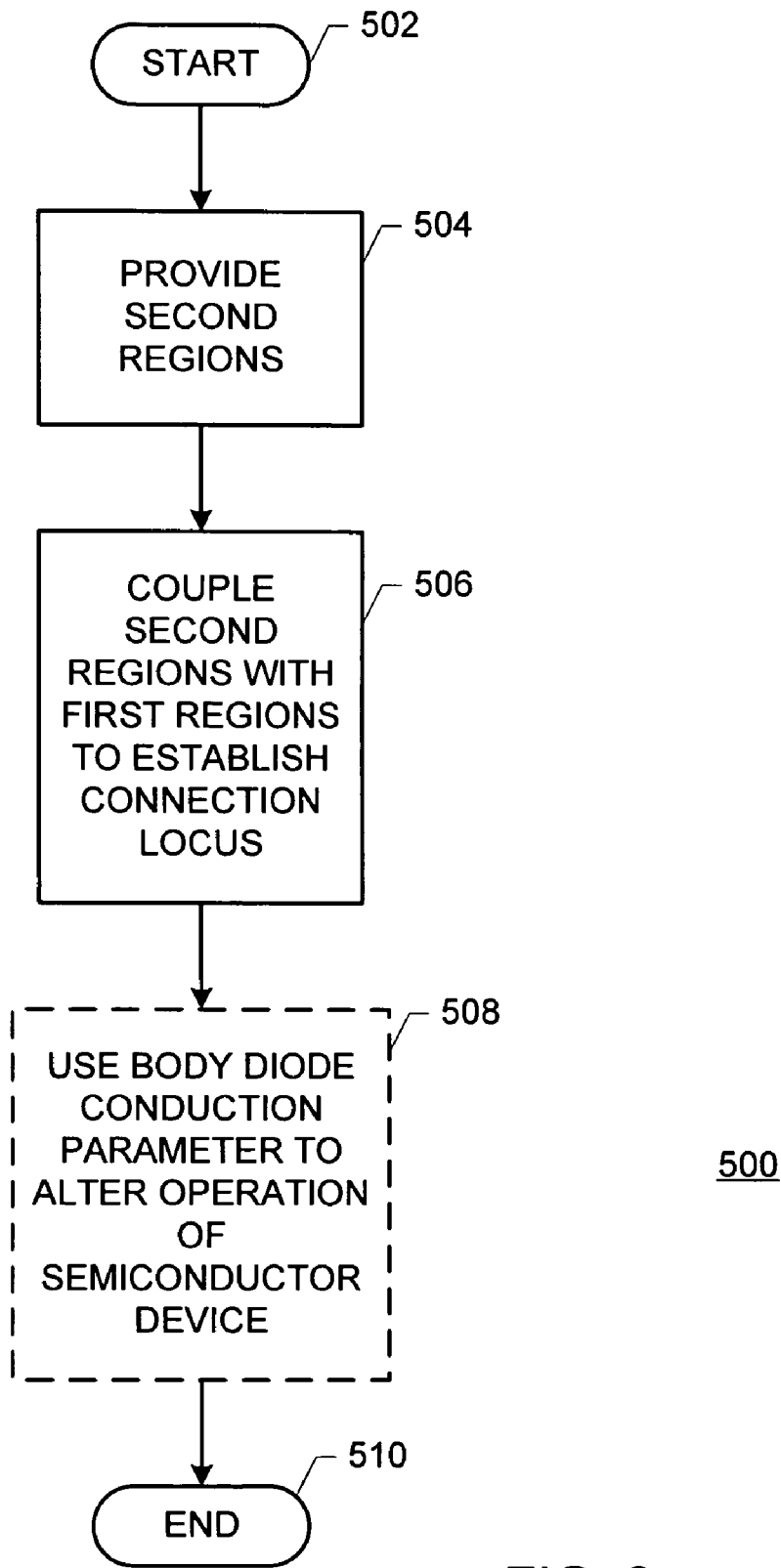
FIG. 9 is a flow diagram illustrating the method of the present invention.

FIG. 9 is a flow diagram illustrating the method of the present invention. In FIG. 9, a method 500 for detecting body diode conduction in a semiconductor device begins at a START locus 502. The semiconductor device includes a first plurality of regions fixed with respect to a substrate having a generally planar upper surface. Respective first regions of the first plurality of regions are configured to establish a source, a gate and a drain arranged to effect drain-to-source current flow generally parallel with the upper surface. The first plurality of regions experiences body diode conduction in a first inter-region current flow other than the drain-to-source current flow among first involved regions of the respective first regions.

Method 500 continues with the step of providing a second plurality of regions fixed with respect to the substrate, as indicated by a block 504. Each respective second region of the second plurality of regions is substantially similar in relative size and in relative placement with respect to other the respective second regions as a corresponding respective first region is in relative size and in relative placement with respect to corresponding other the respective first regions. The second plurality of regions experiences a model body diode conduction in an inter-region current flow between second involved the respective second regions. The second involved respective regions are situated among the second plurality of regions substantially similarly to the first involved respective regions being situated among the first plurality of regions. The model body diode conduction occurs generally contemporaneously with the body diode conduction.

Method 500 continues with the step of coupling selected respective second regions with selected respective first regions to establish a connection locus coupled with at least one of the second involved respective regions to permit detecting the model body diode conduction, as indicated by a block 506.

Method 500 terminates at an END locus 510.

Method 500 may include a step between block 506 and END locus 510 in which the second plurality of regions comprises a scale model of the semiconductor device, as indicated by a dotted-line box 508. The model is preferably substantially smaller than the semiconductor device. The model body conduction is detected as an electrical parameter that is employed to alter operation of the semiconductor device to reduce affect of the body diode conduction on performance of the semiconductor device.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

I claim:

1. An LDMOS device with a body diode current detector, comprising:

(a) an n-well in a semiconductor substrate and extending to a surface of said semiconductor substrate;

(b) a first p-region in said semiconductor substrate and extending to said surface, said first p-region surrounded by said n-well;

(c) an n+drain region in said semiconductor substrate and extending to said surface, said drain region surrounded by said n-well;

(d) an n+source region in said semiconductor substrate and extending to said surface, said source region surrounded by said first p-region and coupled to said p-region;

(e) a first insulated gate over said first p-region between said source region said n-well;

(f) a second p-region in said semiconductor substrate and extending to said surface, said second p-region surrounded by said n-well;

(g) an n+collector region in said semiconductor substrate and extending to said surface, said collector region surrounded by said second p-region, said collector region coupled through a pull-up resistor to a voltage supply; and (h) a second insulated gate over said second p-region between said collector region and said n-well, said second insulated gate coupled to said source region and to said second p-region;

(i) wherein when a first body diode formed by said first p-region and said n-well conducts a first current during operation of the LDMOS formed with said source region, said drain region, and said first insulated gate, a second body diode formed by said second p-region and said n-well conducts a second current through said collector region to said pull-up resistor;

(j) whereby said first current conducted by said first body diode can be detected by measurement of said second current through said collection region to said pull-up resistor.

2. A method of switching upper and lower MOS devices of a half H-bridge, comprising the steps of:

(a) providing a half H-bridge with an upper MOS device and a lower MOS device, wherein said lower MOS device includes:

(i) an n-well in a semiconductor substrate;

(ii) a p-region within said n-well;

(iii) a source region within said p-region and connected to said p-region;

(iv) a drain region within said n-well; and (v) an insulated gate over said p-region between said source region and said n-well;

(b) providing a model MOS device for said lower MOS device, and said model MOS device including:

(i) a second p-region in said n-well;

(ii) a collector region within said second p-region; and (iii) a second insulated gate over said second p-region and between said collector region and said n-well;

(c) connecting said second insulated gate to said source, to said p-region, and to said second p-region;

(d) connecting said collector region to a voltage supply through a pull-up resistor;

(e) measuring current through said pull-up resistor to said collector region;

(f) using results of said current measuring to estimate body diode current in said lower MOS device; and (g) adjusting timing of signals for turning-on and turning-off said lower MOS device according to said body diode current estimate.

* * * * *